United States Patent
Lam et al.

(10) Patent No.: US 6,814,837 B1
(45) Date of Patent: Nov. 9, 2004

(54) CONTROLLED GAS SUPPLY LINE APPARATUS AND PROCESS FOR INFILM AND ONFILM DEFECT REDUCTION

(75) Inventors: Kin-Sang Lam, Austin; Dennis C. Swartz, Buda; Roger Sorum, Pflugerville, all of TX (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/175,930

(22) Filed: Oct. 20, 1998

(51) Int. Cl.[7] .............................................. C23C 14/34
(52) U.S. Cl. ........................... 204/192.1; 204/298.07; 204/298.33; 156/345; 118/716; 438/689; 137/488; 137/492.5; 251/28; 251/30.01; 427/585
(58) Field of Search ...................... 204/192.1, 298.07, 204/298.33; 156/345; 438/689; 118/716; 427/585; 137/488, 492.5; 251/28, 30.01

(56) References Cited

U.S. PATENT DOCUMENTS

| | | | |
|---|---|---|---|
| 4,630,639 A | * | 12/1986 | Akita et al. .................. 137/486 |
| 4,845,416 A | * | 7/1989 | Scholl et al. ................ 318/600 |
| 5,454,920 A | * | 10/1995 | Ishiwata ................. 204/192.13 |
| 5,468,520 A | * | 11/1995 | Williams et al. ............. 427/560 |
| 5,540,821 A |   | 7/1996 | Tepman .................. 204/192.13 |
| 5,735,503 A | * | 4/1998 | Hietkamp ................ 251/30.01 |
| 5,758,680 A | * | 6/1998 | Kaveh et al. .................. 137/14 |
| 5,788,778 A | * | 8/1998 | Shang et al. .................... 134/1 |
| 5,884,894 A | * | 3/1999 | Smith .......................... 251/28 |

* cited by examiner

*Primary Examiner*—Nam Nguyen
*Assistant Examiner*—Steven H. VerSteeg

(57) ABSTRACT

According to one aspect of the disclosure, the present invention provides methods and arrangements for controlling supply process gas to a process chamber for use in the manufacturing industry. Methods include controlling the operation of a valve coupled to the supply process gas line in a way such that pressure bursts in the process chamber due to the operation of the valve are reduced, or even eliminated.

29 Claims, 2 Drawing Sheets

CONTROLLED GAS SUPPLY LINE APPARATUS AND PROCESS FOR INFILM AND ONFILM DEFECT REDUCTION

FIELD OF THE INVENTION

The present invention relates to the production of semiconductor wafers. The present invention has particular application for regulation of gas supply to a low pressure deposition process in the semiconductor wafer manufacturing industry.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions.

An important step in the manufacture of such devices is the formation of layers on the semiconductor wafer. Such layers are deposited using a number of techniques including physical vapor deposition (PVD), commonly known as "sputtering," and chemical vapor deposition (CVD) processes. CVD typically involves the formation of a nonvolatile solid film on a substrate by the reaction of vapor phase chemicals that contain the required constituents. The reactant gases are introduced into a process chamber and are decomposed and reacted at a heated surface to form the thin film on the wafer. PVD primarily involves the deposition of conductive metals onto the wafer, accomplished by generating ions and directing them at a target in order to sputter target atoms, and then transporting the atoms to a wailer where they condense to form a film.

Another important step in the manufacture of such devices is etching. Etching is the erosion of selected portions of a surface in order to remove a specific material or produce a desired surface pattern. The process of etching is accomplished in a similar environment as CVD and PVD.

Typical configurations used in CVD, PVD, and etching processes include a process gas supply, regulated by a first control valve, a mass-flow controller downstream from the first control valve, a second control valve downstream from the mass-flow controller, and a process chamber downstream from the second control valve in which the CVD, PVD, or etching process occurs.

An important element in the operation of CVD, PVD, and etching processes is the delivery of process gas to the process chamber. A component that is used to control the rate of introduction of process gases into the process chamber is referenced to as a Mass-flow controller. Mass-flow controllers typically consist of a mass-flow meter, a controller, and a valve, and are located between a gas source and the process chamber in order to monitor and dispense gases at predetermined rates. Many mass-flow controllers perform well in the control of the delivery of the process gas during normal system operation. However, in many instances, mass-flow controllers are inadequate in controlling the supply of the process gas when first opening the valve to initiate the supply of process gas into the process chamber.

Due to the difficulty in controlling the supply process gas, pressure bursts occur in the process chamber when first opening the second control valve between the mass-flow controller and the process chamber. These pressure bursts may effect a wave of pressure across the process chamber, and may ultimately result in significant defects on and in the product wafer surface film. A reduction in these bursts is a positive step in the direction of eliminating defects.

SUMMARY OF THE INVENTION

The severity of the pressure control problem discussed above is lessened by the use of the method and apparatus described herein. According to one example embodiment, the present invention involves the use of an apparatus for controlling the pressure of supply fluid between a mass-flow controller and a process chamber, wherein the apparatus comprises a valve coupled to the fluid path between the mass-flow controller and the process chamber, and wherein the valve includes a control, responsive to a control input. The apparatus further comprises a second control for controlling the control input, thereby inhibiting pressure bursts downstream in the process chamber.

In another example embodiment, the present invention includes a process for controlling chamber pressure during the manufacture of a semiconductor chip, wherein the process takes place in a system including a mass-flow controller and a process chamber located downstream from the mass-flow controller, and wherein the process chamber is susceptible to significant pressure bursts upstream therefrom. The process includes coupling a pneumatically-operated valve to a first fluid path between the mass-flow controller and the process chamber. The pneumatically-operated valve includes a diaphragm, responsive to a second fluid pressure, that controls the operation of the valve. The process further includes coupling a metering valve to control the second fluid pressure. The metering valve is slowly adjusted, and the second fluid pressure to the diaphragm is altered, thereby inhibiting pressure bursts downstream to the chamber.

The above summary is not intended to characterize each embodiment of the present invention. Other aspects of the present invention will become apparent upon review of the figures and corresponding "Detailed Description".

BRIEF DESCRIPTION OF THE DRAWINGS

Various aspects and advantages of the present invention will become apparent upon reading the following detailed description of various embodiments and upon reference to the drawings in which.

Figure 1:
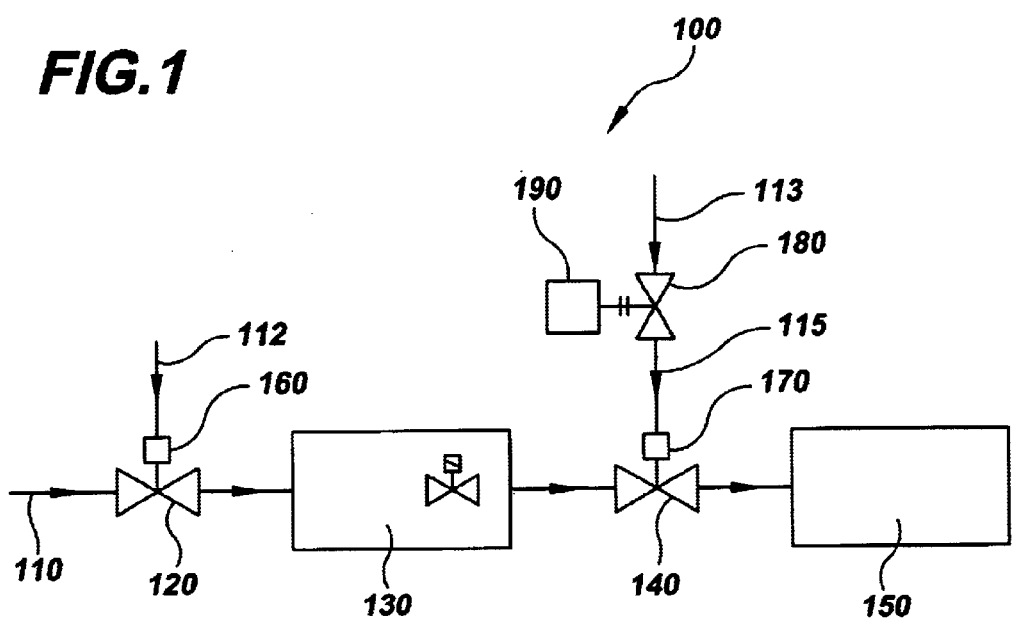
FIG. 1 illustrates a schematic representation of a system, according to an example embodiment of the present invention, including a mass-flow controller and a process chamber, a fluid valve upstream of the mass-flow controller, a fluid valve downstream of the mass-flow controller and upstream of the process chamber, and a valve coupled to the fluid valve downstream of the mass-flow controller.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention is applicable to a variety of processes that require or benefit from the control of pressure fluctuations in a process chamber, such as for use in semiconductor manufacturing. The present invention has been found to be particularly advantageous for use in sputtering, chemical vapor deposition, physical vapor deposition, and etching processes associated with semiconductor manufacturing.

FIG. 1 illustrates a schematic representation 100 of a system, according to an example embodiment of the present invention, for use in the manufacture of semiconductor devices. Supply process gas 110 is coupled to valve 120. Valve 120 is operated via valve control 160. Control signal 112 is coupled to valve control 160. Control signal 112 is used to effect the operation of valve 120. When valve 120 is opened, supply process gas 110 passes through valve 120 and continues downstream to mass-flow controller 130, coupled downstream of valve 120. Mass-flow controller 130 regulates the mass-flow of the supply process gas 110.

After passing through the mass-flow controller 110, supply process gas 110 continues downstream to valve 140. Valve 140 may comprise, for example, a pneumatic valve, a pneumatic solenoid valve, an electric solenoid valve, an electromechanical valve, and the like. Valve 140 is operated via valve control 170. Valve control 170 is coupled to control signal 115. Control signal 115 is used to effect the operation of valve 140. Control signal 115 is coupled to control valve 180. Control valve 180 is coupled to control signal supply 113. Control valve 180 is further coupled to a control 190 for effecting the smooth operation of control valve 180.

The foregoing combination of a control signal coupled to valve, wherein the control signal itself may be carefully managed, enables regulated operation of the valve, thereby enabling the inhibition of pressure bursts downstream from the valve.

When valve 140 is opened, supply process gas 110 continues downstream to process chamber 150. Processes occurring in the process chamber may include, for example, sputtering, CVD, PVD, etching, or the like. Since valve 140 is the last control effected onto supply process gas 110 prior to delivery to process chamber 150, regulated control of valve 140 is important in the control of the rate at which supply process gas 110 enters process chamber 150. The use of control valve 180 and control 190 to manage control signal 115 provides an effective manner in which to operate valve control 170, thereby actuating valve 140, and thus reducing or eliminating pressure bursts in the process chamber 150.

The regulation of pressure bursts in the process chamber can be an important step in reducing film defects in the semiconductor device manufacturing industry. For example, the invention herein may be used to hold the rate of increase in chamber pressure upon opening of the control valve to less than about $2 \times 10^{-4}$ Torr/second, and preferably to less than $1.8 \times 10^{-6}$ Torr/second. In a more specific example, the rate of increase in chamber pressure upon opening of the control valve is held to less than approximately $1.98 \times 10^{-4}$ Torr/second, and preferably to less than approximately $1.8 \times 10^{-6}$ Torr/second. In a further example, the rate of increase in process chamber pressure is held to less than one decade per half second, and preferably less than one decade per second, wherein an increase of one decade is commensurate with an increase in pressure from $1 \times 10^{-6}$ Torr to $1 \times 10^{-5}$ Torr.

According to another example embodiment of the present invention, referring to FIG. 1, valve 140 includes a pneumatic valve controlled by a valve control 170, wherein valve control 170 includes a diaphragm. Valve control 170 is coupled to control signal 115, wherein control signal 115 comprises air. Control signal 115 is coupled to control valve 180, wherein control valve 180 includes a metering valve. Control valve 180 is coupled to control signal supply 113, wherein control signal supply 113 comprises compressed air. Control valve 180 is further coupled to control 190 for controlling the control valve. Control 190 may include a data processing system, a manually adjustable control, an automatic control, a programmable logic controller, solid state electronics, and the like.

Control 190 sets the rate at which the metering valve delivers control signal supply air to the diaphragm. Slowly incrementing the rate at which the metering valve delivers air to the diaphragm results in slow and smooth operation of the pneumatic valve. Beginning from zero, and slowly incrementing the rate at which the metering valve delivers air to the diaphragm results in the pneumatic valve slowly opening from a full close position, thereby reducing or eliminating pressure bursts in the process chamber upon initial opening of the valve 140, and ultimately reducing film manufacturing defects in semiconductor devices.

Figure 2:
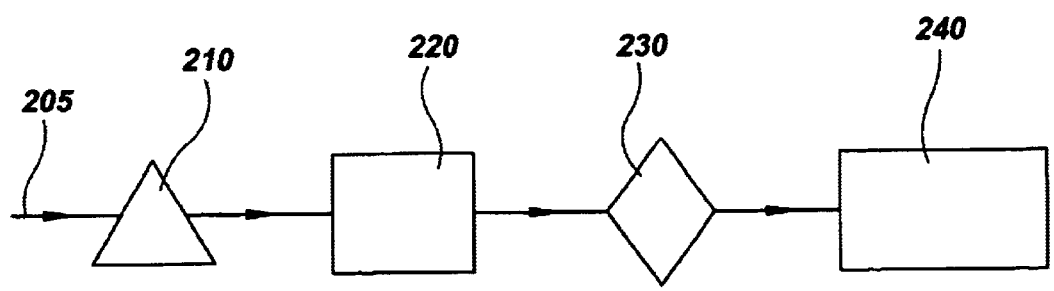
FIG. 2 illustrates a flow diagram representing an operation of a system, according to another example embodiment of the present invention.

FIG. 2 illustrates a flow diagram representing the control of a system, according to another example embodiment of the present invention, for use in the semiconductor manufacturing industry. Supply process gas 205 is coupled to valve 210 for controlling the supply process gas line. Mass-flow controller 220 is coupled downstream of valve 210. An apparatus 230 for controlling the supply process gas and for reducing or eliminating pressure bursts is coupled downstream of mass-flow controller 220. Process chamber 240 is coupled downstream of apparatus 230. Apparatus 230 for controlling pressure bursts provides improved process chamber 240 conditions as compared to a system without apparatus 230, since a reduction or elimination of pressure bursts may result in fewer film defects in semiconductor products produced in process chamber 240.

Figure 3:
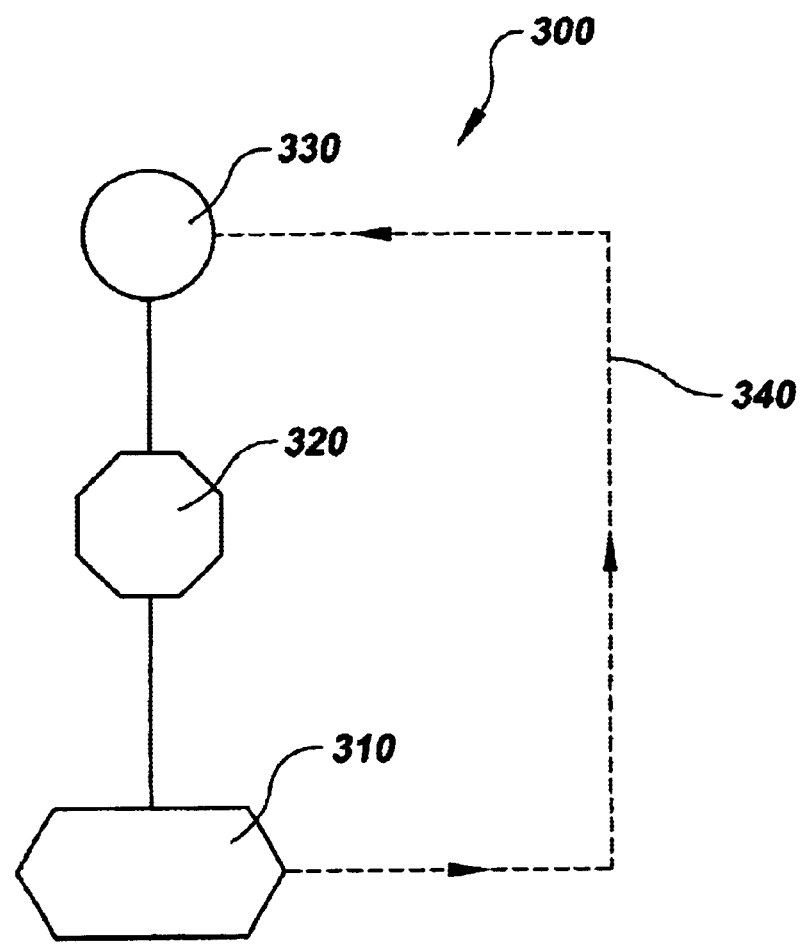
FIG. 3 illustrates a control apparatus, according to an example embodiment of the present invention, and useful for the system of FIG. 1.

According to another example embodiment of the present invention, FIG. 3 illustrates a schematic representation of an apparatus 300 for controlling the operation of a valve 310, for use in the semiconductor manufacturing industry. The apparatus includes a control valve 320 coupled to valve 310. The apparatus further includes a means 330 to operate control valve 320.

Control device 330 can optionally be coupled to a feedback loop 340. The feedback loop 340 may be used to provide a measure of the performance of valve 310, wherein the measure is used by control device 330 and for determining the operation of control valve 320.

Referring again to FIG. 3, according to another example embodiment of the present invention, valve 310 includes a pneumatically operated valve, including a diaphragm for effecting the operation of the valve. The diaphragm is coupled to control air which is coupled to control valve 320. Control valve 320 includes a metering valve. The metering valve is coupled to apparatus 330 for operating the metering valve. Apparatus 330 may include manual or automatic operation of the metering valve. The use of the metering valve provides regulated control of the actuation of the pneumatic valve, resulting in a reduction in pressure bursts downstream of the valve 310 that typically occur due to non-regulated control of the actuation of the pneumatic valve. The use of this example embodiment of the present invention, when used to control supply air to a process chamber used in the manufacture of semiconductor devices, results in the reduction of film manufacturing defects in the semiconductor devices.

Optionally, control device 330 may further include a data processing system, such as a personal computer, a programmable logic controller, and the like, for effecting the automatic operation of the metering valve. The use of a data processing system provides highly flexible control of the metering valve, with many options for control parameters, thereby reducing pressure bursts downstream of the valve 310. Furthermore, the data processing system can be coupled with a feedback loop 340 to even better regulate the actuation of the valve 310.

The various embodiments described above are provided by way of illustration only and should not be construed to limit the invention. Those skilled in the art will readily recognize various modifications and changes which may be made to the present invention. For example, various different types of valves and mechanisms to control the valves can be used. Such valves include ball valves, pneumatic valves, gate valves, solenoid valves, manual valves, mechanical valves, and the like. Such mechanisms to control the valves include diaphragms, solenoids, metering valves, pressure measuring devices, data processing systems, solid state electronics, and the like. As another example, various types of control signals may be used. Such control signals may be air, water, fluid, electric, pneumatic, hydraulic, fiber optic, and the like. These modifications do not depart from the teaching, or the true spirit and scope, of the present invention. The invention is set forth in the following claims.

What is claimed is:

1. In a system including a mass-flow controller and a process chamber located downstream from the mass-flow controller and wherein the process chamber is susceptible to significant pressure bursts upstream therefrom, an apparatus for controlling chamber pressure during manufacture of a semiconductor chip, the apparatus comprising:
   a valve coupled to a first fluid path between the mass-flow controller and the process chamber, the valve including a first control means, responsive to a control input, for controlling the valve; and
   a second control means for controlling the control input and inhibiting pressure bursts downstream to the chamber.

2. An apparatus for controlling chamber pressure, according to claim 1, wherein the first control means includes a diaphragm, and wherein the control input is a second fluid characterized by a second fluid pressure.

3. An apparatus for controlling chamber pressure, according to claim 1, wherein the first control means includes a pneumatic solenoid, and wherein the control input is air characterized by an air pressure.

4. An apparatus for controlling chamber pressure, according to claim 1, wherein the first control means includes an electric solenoid, and wherein the control input is an electrical signal.

5. An apparatus for controlling chamber pressure, according to claim 1, further comprising a third control means to control the second control means.

6. An apparatus for controlling chamber pressure, according to claim 1, wherein the process in the chamber is a sputtering process for altering a surface of the semiconductor chip.

7. An apparatus for controlling chamber pressure, according to claim 1, wherein the process in the chamber is a chemical vapor deposition process for altering a surface of the semiconductor chip.

8. An apparatus for controlling chamber pressure, according to claim 1, wherein the process in the chamber is a physical vapor deposition process for altering a surface of the semiconductor chip.

9. An apparatus for controlling chamber pressure, according to claim 1, wherein the process in the chamber is an etching process for altering a surface of the semiconductor chip.

10. An apparatus for controlling chamber pressure, according to claim 1, wherein the rate of increase of the chamber pressure is held to less than approximately $1.8 \times 10^{-6}$ Torr/second.

11. An apparatus for controlling chamber pressure, according to claim 1, wherein the rate of increase of the chamber pressure is held to less approximately $1.98 \times 10^{-4}$ Torr/second.

12. An apparatus for controlling chamber pressure, according to claim 1, wherein the rate of increase of the chamber pressure is held to less than about $2 \times 10^{-4}$ Torr/second.

13. An apparatus for controlling chamber pressure, according to claim 1, wherein the rate of increase of the chamber pressure is held to less than about $2 \times 10^{-6}$ Torr/second.

14. In a system including a mass-flow controller and a process chamber located downstream from the mass-flow controller and wherein the process chamber is susceptible to significant pressure bursts upstream therefrom, a process for controlling chamber pressure during manufacture of a semiconductor chip, the process comprising the steps of:
   providing a pneumatically-operated valve coupled to a first fluid path between the massflow controller and the process chamber, the pneumatically-operated valve including a diaphragm responsive to a second fluid pressure, wherein the diaphragm controls the operation of the valve;
   providing a metering valve coupled to control the diaphragm; and
   slowly adjusting the metering valve and altering the second fluid pressure to the diaphragm and inhibiting pressure bursts downstream to the chamber.

15. A process for controlling chamber pressure, according to claim 14, wherein the step of providing a metering valve coupled to control the diaphragm includes coupling the metering valve to control the second fluid pressure of the diaphragm directly.

16. A process for controlling chamber pressure, according to claim 14, wherein the process in the chamber is a sputtering process for altering a surface of the semiconductor chip.

17. A process for controlling chamber pressure, according to claim 14, wherein the process in the chamber is a chemical vapor deposition process for altering a surface of the semiconductor chip.

18. A process for controlling chamber pressure, according to claim 14, wherein the process in the chamber includes a physical vapor deposition process for altering a surface of the semiconductor chip.

19. A process for controlling chamber pressure, according to claim 14, wherein the process in the chamber is an etching process for altering a surface of the semiconductor chip.

20. A process for controlling chamber pressure, according to claim 14, wherein the rate of increase of the chamber pressure is held to less than $1.8 \times 10^{-6}$ Torr/second.

21. A process for controlling chamber pressure, according to claim 14, wherein the rate of increase of the chamber pressure is held to less than $1.98 \times 10^{-4}$ Torr/second.

22. A process for controlling chamber pressure, according to claim 14, wherein the rate of increase of the chamber pressure is held to less than about $2 \times 10^{-6}$ Torr/second.

23. A process for controlling chamber pressure, according to claim 14, wherein the rate of increase of the chamber pressure is held to less than about $2 \times 10^{-4}$ Torr/second.

24. A process for controlling chamber pressure, according to claim 14, wherein the operation of the metering valve is controlled by a data processing system coupled to the metering valve, and configured and arranged to provide the control signal to the metering valve.

25. In a system including a mass-flow controller and a process chamber located downstream from the mass-flow controller and wherein the process chamber is susceptible to significant pressure bursts upstream therefrom, an apparatus for controlling chamber pressure during manufacture of a semiconductor chip, the apparatus comprising:
   a pneumatically operated valve having a diaphragm and coupled to a fluid line between the mass-flow controller and the process chamber, and
   a metering valve for controlling the diaphragm of the pneumatically-operated valve.

26. An apparatus for controlling chamber pressure, according to claim 25, wherein the metering valve for controlling the diaphragm is coupled to control the fluid pressure of the diaphragm directly.

27. An apparatus for controlling chamber pressure, according to claim 25, further comprising a data processing system coupled to the metering valve, and configured and arranged to provide control to the metering valve.

28. An apparatus for controlling chamber pressure, according to claim 27, further comprising a feedback loop.

29. An apparatus for controlling chamber pressure, according to claim 25, further comprising a manually operated control coupled to control the metering valve.

* * * * *